(12) United States Patent
Klem et al.

(10) Patent No.: US 8,729,528 B2
(45) Date of Patent: May 20, 2014

(54) QUANTUM DOT-FULLERENE JUNCTION OPTOELECTRONIC DEVICES

(75) Inventors: Ethan Klem, Durham, NC (US); John Lewis, Durham, NC (US)

(73) Assignee: Research Triangle Institute, Durham, NC (US)

( * ) Notice: Subject to any disclaimer, the term of this patent is extended or adjusted under 35 U.S.C. 154(b) by 0 days.

(21) Appl. No.: 13/499,024

(22) PCT Filed: Sep. 29, 2010

(86) PCT No.: PCT/US2010/050712
§ 371 (c)(1),
(2), (4) Date: Jun. 13, 2012

(87) PCT Pub. No.: WO2011/041407
PCT Pub. Date: Apr. 7, 2011

(65) Prior Publication Data
US 2012/0241723 A1 Sep. 27, 2012

Related U.S. Application Data

(60) Provisional application No. 61/312,494, filed on Mar. 10, 2010, provisional application No. 61/246,679, filed on Sep. 29, 2009.

(51) Int. Cl.
*H01L 29/06* (2006.01)

(52) U.S. Cl.
USPC ............ 257/21; 438/94; 257/E25.032

(58) Field of Classification Search
USPC ............ 257/21, 12, 184, 292, E21.404, 257/E25.032; 438/73, 94
See application file for complete search history.

(56) References Cited

U.S. PATENT DOCUMENTS

| | | | |
|---|---|---|---|
| 4,965,649 A | 10/1990 | Zanio et al. |
| 5,077,593 A | 12/1991 | Sato et al. |
| 5,505,928 A | 4/1996 | Alivisatos et al. |
| 5,949,064 A | 9/1999 | Chow et al. |
| 6,207,229 B1 | 3/2001 | Bawendi et al. |
| 6,300,612 B1 | 10/2001 | Yu |
| 6,329,668 B1 | 12/2001 | Razeghi |
| 6,455,872 B1 | 9/2002 | Williams et al. |

(Continued)

FOREIGN PATENT DOCUMENTS

| | | |
|---|---|---|
| JP | 2004165516 A | 6/2004 |
| JP | 2008509559 A | 3/2008 |
| JP | 2009099866 A | 5/2009 |
| JP | 2009532851 A | 9/2009 |

OTHER PUBLICATIONS

Rausch et al., "Near-Infrared Imaging with Quantum-Dot-Sensitized Organic Photodiodes," Nature Photonics, vol. 3, Jun. 2009.

(Continued)

*Primary Examiner* — Quoc Hoang
(74) *Attorney, Agent, or Firm* — Olive Law Group, PLLC

(57) ABSTRACT

An optoelectronic device includes a first electrode, a quantum dot layer disposed on the first electrode including a plurality of quantum dots, a fullerene layer disposed directly on the quantum dot layer wherein the quantum dot layer and the fullerene layer form an electronic heterojunction, and a second electrode disposed on the fullerene layer. The device may include an electron blocking layer. The quantum dot layer may be modified by a chemical treatment to exhibit increased charge carrier mobility.

33 Claims, 4 Drawing Sheets

(56) References Cited

U.S. PATENT DOCUMENTS

| | | | |
|---|---|---|---|
| 6,504,196 | B1 | 1/2003 | Rhodes |
| 6,580,027 | B2 | 6/2003 | Forrest et al. |
| 6,710,366 | B1 | 3/2004 | Lee et al. |
| 6,852,920 | B2 | 2/2005 | Sager et al. |
| 6,878,871 | B2 | 4/2005 | Scher et al. |
| 6,906,326 | B2 | 6/2005 | Koch et al. |
| 6,972,431 | B2 | 12/2005 | Forrest et al. |
| 7,042,029 | B2 | 5/2006 | Graetzel et al. |
| 7,326,908 | B2 | 2/2008 | Sargent et al. |
| 7,391,024 | B2 | 6/2008 | Garber et al. |
| 7,459,686 | B2 | 12/2008 | Syllaios et al. |
| 2001/0028055 | A1 | 10/2001 | Fafard et al. |
| 2006/0032530 | A1 | 2/2006 | Afzali-Ardakani et al. |
| 2006/0138396 | A1 | 6/2006 | Lin et al. |
| 2006/0243959 | A1 | 11/2006 | Sargent et al. |
| 2007/0025139 | A1 | 2/2007 | Parsons |
| 2007/0096078 | A1 | 5/2007 | Lee et al. |
| 2007/0215860 | A1 | 9/2007 | Komiyama et al. |
| 2008/0048102 | A1 | 2/2008 | Kurtz et al. |
| 2008/0128021 | A1 | 6/2008 | Choudhury et al. |
| 2008/0178924 | A1 | 7/2008 | Kempa et al. |
| 2008/0202581 | A1 | 8/2008 | Kempa |
| 2008/0216894 | A1 | 9/2008 | Hammond |
| 2008/0230120 | A1 | 9/2008 | Reddy |
| 2012/0223291 | A1* | 9/2012 | Klem et al. ............... 257/21 |

OTHER PUBLICATIONS

Dissanayake et al., "Measurement and Validation of PbS nanocrystal Energy Levels," Applied Physics Letters, vol. 93, 043501, 2008.

Bjorstrom et al., "Multilayer Formation in Spin-Coated Thin Films of Low-Bandgap Polyfluorene:PCBM Blends," J. Phys.: Condens. Matter, vol. 17, 2005, L529-L534.

Wu et al., "Programmable Organic Light-Emitting Devices," Applied Physics Letters, vol. 79, No. 19, Nov. 5, 2001.

Osedach et al., "Lateral Heterojunction Photodetector Consisting of Molecular Organic and Colloidal Quantum Dot Thin Films," Applied Physics Letters, vol. 94, 043307, 2009.

Kim et al., "Contact Printing of Quantum Dot Light-Emitting Devices," Nano Letters, American Chemical Society, 2008.

Sargent, "Infrared Photovoltaics Made by Solution Processing," Nature Photonics, vol. 3, Jun. 2009.

McBranch et al., Optical Limiting in Fullerene Solutions and Doped Glasses,: SPIE Proceedings, "Fullerenes and Photonics II," San Diego, CA, 1985.

Liu, "Quantum Dot Infrafed Photodetector," Opto-Electronics Review, vol. 11, No. 1, pp. 1-5, 2003.

Dissanayake, et al; The fabrication and analysis of a PbS nanocrystal: C60 bilayer hybrid photovoltaic system; Nanotechnology 20; 2009; pp. 245202-1-245202-5.

Dissanayake, et al.; Organic: PbS-nanocrystal: Fullerene Hybrid Photovoltaics; Mater. Res. Soc. Symp. Proc., 2008; vol. 1102; pp. 1102-LL07-06.

Japanese Office Action and translation dated Jul. 25, 2013 for Japanese Patent Application No. 2012-531121.

Japanese Office Action translation dated Aug. 19, 2013 for Japanese Patent Application No. 2012-531123.

International Preliminary Report on Patentability dated Apr. 12, 2012 for PCT/US2010/050712.

International Search Report for PCT/US2010/050712 dated Sep. 29, 2010.

International Preliminary Report on Patentability dated Apr. 12, 2012 for PCT/US2010/050731.

International Search Report for PCT/US2010/050731 dated Jul. 29, 2010.

* cited by examiner

QUANTUM DOT-FULLERENE JUNCTION OPTOELECTRONIC DEVICES

RELATED APPLICATIONS

This application is the national stage of International Application No. PCT/US2010/050712, filed Sep. 29, 2010, titled "QUANTUM DOT-FULLERENE JUNCTION OPTOELECTRONIC DEVICES;" which claims the benefit of U.S. Provisional Patent Application Ser. No. 61/246,679, filed Sep. 29, 2009, titled "QUANTUM DOT-FULLERENE JUNCTION OPTOELECTRONIC DEVICES;" and U.S. Provisional Patent Application Ser. No. 61/312,494, filed Mar. 10, 2010, titled "QUANTUM DOT-FULLERENE JUNCTION BASED PHOTODETECTORS;" the contents of which are each incorporated by reference herein in their entireties.

TECHNICAL FIELD

The present invention relates generally to heterojunctions formed by quantum dot and fullerene layers, optoelectronic devices based on such heterojunctions, and methods for fabricating such heterojunctions and optoelectronic devices.

BACKGROUND

Optoelectronic devices include photovoltaic (PV) devices (solar cells), photodetectors, and like devices, as well as electroluminescent (EL) devices such as light-emitting diodes (LEDs) and laser diodes (LDs). A PV device generates electric power when light is incident upon its active layer. When sunlight is utilized as the source of incident electromagnetic radiation, the PV device may be referred to as a solar cell. In general, a PV device is based on a junction formed by a pair of two different types of semiconductors (e.g., an n-type and a p-type material, or an electron acceptor and an electron donor material). When a photon's energy is higher than the band gap value of the semiconductor, the photon can be absorbed in the semiconductor and the photon's energy excites a negative charge (electron) and a positive charge (hole). For the excited electron-hole pair to be successfully utilized in an external electrical circuit, the electron and the hole must first be separated before being collected at and extracted by respective opposing electrodes. This process is called charge separation and is required for the photovoltaic effect to occur. If the charges do not separate they can recombine and thus not contribute to the current generated by the PV device. A photodetector operates similarly to a PV device, but is configured to sense the incidence of light or measure the intensity, attenuation or transmission of incident light. Also, the operation of a photodetector entails the application of an external bias voltage whereas the operation of a PV device does not. Moreover, a photodetector is often intended to detect only a narrow range of wavelengths (e.g, an IR detector or UV detector), whereas a PV device is typically desired to be responsive to as wide a range of wavelengths as possible for maximum generation of electrical power.

Optoelectronic devices also include electroluminescent (EL) devices such as light-emitting diodes (LEDs) and laser diodes (LDs). In a general sense, EL devices operate in the reverse of PV devices. Electrons and holes are injected into the semiconductor region from the respective electrodes under the influence of an applied bias voltage. One of the semiconductor layers is selected for its light-emitting properties rather than light-absorbing properties. Radiative recombination of the injected electrons and holes causes the light emission in this layer. Many of the same types of materials employed in PV devices may likewise be employed in EL devices, although layer thicknesses and other parameters must be adapted to achieve the different goal of the EL device.

In PV and related optoelectronic devices, the efficiency with which optical energy is converted to electrical power is a key figure of merit. Another performance-related criterion is the open-circuit voltage $V_{oc}$, the maximum possible voltage when the PV device is irradiated without being connected to any external load. Another performance-related criterion is the short-circuit current $J_{sc}$, the maximum possible current when the PV device is irradiated and electrically connected to a zero-resistance load. Another performance-related criterion is quantum efficiency, which includes both external quantum efficiency (EQE) and internal quantum efficiency (IQE). EQE corresponds to the percentage of total incident photons that are converted to electrical current, and IQE corresponds to the percentage of total absorbed photons that are converted to electrical current. Another performance-related criterion is the power conversion efficiency, which corresponds to the percentage of the incident optical power that is usable as electrical power.

In addition, charge carrier mobility within the constituent layers is a key material property that affects the performance of the device. Charge carrier mobility is a material property that describes the velocity of a charge carrier in the presence of an electric field. In PV devices a larger value of mobility means that charge carriers move more freely and can be extracted from the device more efficiently. This results in higher device performance as compared devices with lower charge carrier mobility. A related property is exciton diffusion length. This is a material property that describes the average distance that an exciton (an electron-hole pair) will travel before the charge carriers recombine. In a PV device where excitons play a significant role, a larger value means that there is a higher probability that photogenerated excitons will reach a charge separation region prior to recombination, and also leads to a higher device performance than a PV device with a lower exciton diffusion length.

While mobility and exciton diffusion are separate properties, their values are affected by similar material attributes. For example, defects, charge trapping sites, and grain boundaries all inhibit carrier transport and result in lower mobility as well as lower exciton diffusion length. While enhanced mobility is discussed throughout this document, it is understood that similar results are obtained for enhanced exciton diffusion length.

Conventionally, PV devices and other optoelectronic devices have utilized bulk and thin-film inorganic semiconductor materials to provide p-n junctions for separating electrons and holes in response to absorption of photons. In particular, electronic junctions are typically formed by various combinations of intrinsic, p-type doped and n-type doped silicon. The fabrication techniques for such inorganic semiconductors are well-known as they are derived from many years of experience and expertise in microelectronics. Nonetheless, these fabrication techniques are expensive. Successful crystal growth requires the minimization of defects and unwanted impurities, as well as the precise doping of intended impurities to achieve desired functions, in a high-vacuum, contamination-free deposition chamber under tightly controlled operating conditions. Group III-V materials such as gallium arsenide (GaAs) and $Al_xGa_yIn_zN$ ($x+y+z=1$, $0 \leq x \leq 1$, $0 \leq y \leq 1$, $0 \leq z \leq 1$), as well as Si-inclusive compounds such as silicon carbide (SiC) and silicon-germanium (SiGe), have also been utilized but suffer from the same problems. Other inorganic materials such as amorphous silicon, polycrystalline silicon, cadmium telluride (CdTe), copper indium diselenide (CuInSe$_2$ or CIS) and copper indium/gallium diselenide (CuIn$_x$Ga$_{(1-x)}$Se$_2$ or CIGS) may be less expensive to fabricate than single crystal silicon, but are less efficient and still require expensive semiconductor-grade processing that has not yet reduced costs sufficiently to reach parity with traditional sources of electricity.

More recently, optoelectronic devices formed from organic materials (polymers and small molecules) are being investigated, but have enjoyed limited success. The active region in these devices is based on a heterojunction formed by an organic electron donor layer and an organic electron acceptor layer. A photon absorbed in the active region excites an exciton, an electron-hole pair in a bound state that can be transported as a quasi-particle. The photogenerated exciton becomes separated (dissociated or "ionized") when it diffuses to the heterojunction interface. Similar to the case of inorganic PV devices, it is desirable to separate as many of the photogenerated excitons as possible and collect them at the respective electrodes before they recombine. It can therefore be advantageous to include layers in the device structure that help confine excitons to charge separation regions. These layers may also serve to help transport one type of charge carrier to one electrode, while blocking other charge carriers, thereby improving the efficiency of charge carrier extraction.

While many types of organic semiconductor layers can be fabricated at relatively low-cost, their power conversion efficiency has been lower than inorganic semiconductors due in part to short exciton diffusion lengths. Moreover, most organic semiconductor layers are ineffective for harvesting infrared (IR) photons, which is disadvantageous as IR radiation constitutes a significant portion of the radiation available for conversion to electricity or to other colors of light. As much as 50% or more of solar radiation are wavelengths longer than 700 nm. Moreover, organic materials are often prone to degradation by UV radiation or heat.

Even more recently, quantum dots (QDs), or nanocrystals, have been investigated for use in optoelectronic devices because various species exhibit IR sensitivity and their optoelectronic properties (e.g., band gaps) are tunable by controlling their size. Thus far, QDs have been employed in prototype optoelectronic devices mostly as individual layers to perform a specific function such as visible or IR emission, visible or IR absorption, or red-shifting. Moreover, optoelectronic devices incorporating QDs have typically exhibited low carrier mobility and short diffusion length.

A recent report by Dissanayake et al., "Measurement and validation of PbS nanocrystal energy levels," Appl. Phys. Lett. 93, 043501 (2008), incorporated by reference herein in its entirety, described the use of a heterojunction between PbS nanocrystals (PbS-NCs) and C$_{60}$ fullerenes to verify the band energy alignment of the PbS-NC layer. In this study, the PbS-NC layer was spun cast from toluene onto a buffer layer of poly(3,4-ethylenedioxythiophene)-poly(styrenesulfonate) (PEDOT:PSS), and the fullerene layer subsequently evaporated on top. This was followed by a layer of bathocuproine (BCP) and an aluminum electrode. The structure was tested in photovoltaic mode and provided a modest J$_{sc}$ of ~2 mA/cm$^2$, a V$_{oc}$ of ~250 mV, and therefore an overall power conversion efficiency of approximately 0.25%. No suggestions were made for methods or approaches to improve the performance of this device.

There is an ongoing need for optoelectronic devices with improved material properties and performance-related parameters such as more efficient charge separation, greater charge carrier mobility, higher open circuit voltages, longer diffusion lengths, higher power conversion efficiency, and sensitivity tunable to a desired range of electromagnetic spectra. There is also a need for lower cost, more reliable and more facile methods for fabricating such optoelectronic devices.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, an optoelectronic device includes a first electrode, a quantum dot layer disposed on the first electrode including a plurality of quantum dots, a fullerene layer disposed directly on the quantum dot layer wherein the quantum dot layer and the fullerene layer form an electronic heterojunction, and a second electrode disposed on the fullerene layer. In another implementation, the quantum dots or quantum dot layer may be modified to exhibit high charge carrier mobility.

According to another implementation, an electron blocking layer is interposed between the first electrode and the quantum dot layer. In some implementations, the electron blocking layer is a discontinuous layer.

According to another implementation, an optoelectronic device includes a quantum dot-fullerene junction, wherein the quantum dot layer exhibits a charge carrier mobility greater than $1 \times 10^{-4}$ V/cm$^2$-sec.

According to another implementation, an optoelectronic device includes a quantum dot-fullerene junction, wherein the quantum dot layer exhibits a charge carrier mobility greater than $5 \times 10^{-4}$ V/cm$^2$-sec.

According to another implementation, an optoelectronic device includes a quantum dot-fullerene junction, wherein the quantum dot layer exhibits a charge carrier mobility ranging from greater than $1 \times 10^{-4}$ V/cm$^2$-sec to 10 V/cm$^2$-sec.

In some implementations, at least some of the quantum dots have a core-shell configuration, including a core of a first composition and a shell of a second composition different from the first composition.

In some implementations, the quantum dot layer and/or the fullerene layer includes a matrix material in which the quantum dots are dispersed.

In some implementations, the optoelectronic device further includes a substrate on which the first electrode is disposed. In various implementations, the substrate has a composition of glass, ceramic, polymer, dielectric material, semiconductor, metal, metal-inclusive compound, or metal-inclusive alloy.

According to another implementation, an optoelectronic device includes a first electrode, a quantum dot layer disposed on the first electrode, a fullerene layer disposed directly on the quantum dot layer, and a second electrode disposed on the fullerene layer. The quantum dot layer includes a plurality of quantum dots and has a charge carrier mobility greater than $1 \times 10^{-4}$ cm$^2$/V-sec. The quantum dot layer and the fullerene layer form an electronic heterojunction.

According to another implementation, an optoelectronic device includes a first electrode, a quantum dot layer disposed on the first electrode, a fullerene layer disposed directly on the quantum dot layer, and a second electrode disposed on the fullerene layer. The quantum dot layer includes a plurality of quantum dots and has an interparticle spacing of 2 nm or less. The quantum dot layer and the fullerene layer form an electronic heterojunction.

According to another implementation, a method is provided for fabricating an optoelectronic device. A quantum dot layer is deposited on an electrode, the quantum dot layer comprising a plurality of quantum dots. A fullerene layer is deposited directly on the quantum dot layer, wherein the quantum dot layer and the fullerene layer form an electronic heterojunction.

According to another implementation, an electron blocking layer is formed on the electrode, and the quantum dot layer is formed on the electron blocking layer. In some implementations, the effectiveness of the electron blocking layer may be improved by subjecting the electron blocking layer to an oxidizing or reducing treatment, such as by annealing the electron blocking layer in various oxidizing or reducing atmospheres or exposing the electron blocking layer to an oxidizing or reducing plasma.

According to another implementation, the quantum dots and/or the fullerene layer are dispersed in a matrix.

According to another implementation, an additional electrode is formed on the fullerene layer.

According to another implementation, a method is provided for fabricating an optoelectronic device. A quantum dot layer is deposited on an electrode, the quantum dot layer comprising a plurality of quantum dots. The quantum dot layer is chemically treated after being deposited on the electrode to produce an increased charge carrier mobility. The charge carrier mobility may be greater than $1\times10^{-4}$ $V/cm^2$-sec. A fullerene layer is deposited directly on the quantum dot layer, wherein the quantum dot layer and the fullerene layer form an electronic heterojunction.

According to another implementation, the quantum dot layer is treated with a chemistry that reduces an interparticle spacing between quantum dots. In some implementations, the resulting interparticle spacing is 2 nm or less.

According to another implementation, the quantum dot layer is treated with a chemistry that reduces the as-deposited thickness of the quantum dot layer. In some implementations, the thickness is reduced by 20 to 80%.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
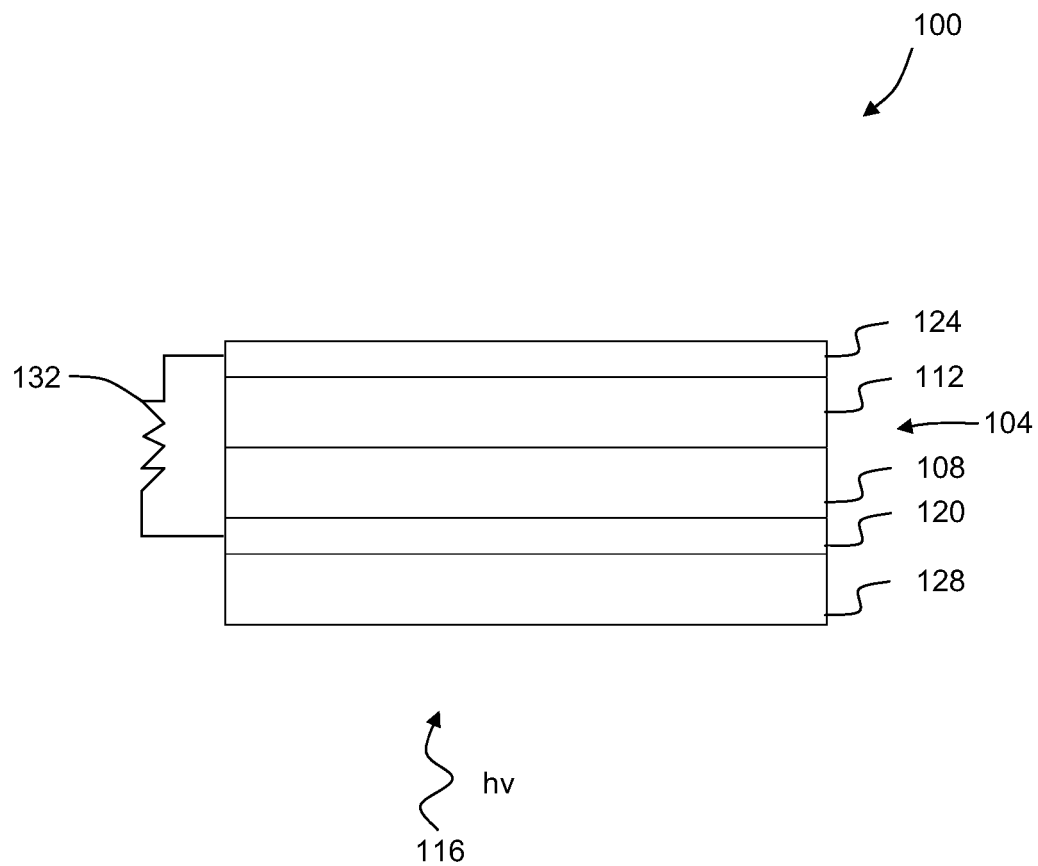
FIG. 1 is a schematic cross-sectional view of an example of an optoelectronic device according to certain implementations of the present disclosure.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction.

As used herein, the term "optoelectronic device" generally refers to any device that acts as an optical-to-electrical transducer or an electrical-to-optical transducer. Accordingly, the term "optoelectronic device" may refer to, for example, a photovoltaic (PV) device (e.g., a solar cell), a photodetector, a thermovoltaic cell, or an electroluminescent (EL) device such as an LED or an LD.

As used herein, the term "fullerene" refers to the buckminsterfullerene $C_{60}$ as well as other forms of molecular carbon, such as $C_{70}$, $C_{84}$, and similar cage-like carbon structures, and more generally may range from 20 to several hundreds of carbon atoms, i.e., $C_n$ where n is 20 or greater. The fullerene may be functionalized or chemically modified as desired for a specific purpose such as, for example, improving solubility or dispersability or modifying the electrical properties of the fullerene. The term "fullerene" may also refer to endohedral fullerenes wherein a non-carbon atom or atomic cluster is enclosed in the carbon cage. The term "fullerene" may also refer to fullerene derivatives. A few non-limiting examples of fullerene derivatives are [6,6]-phenyl-$C_{61}$-butyric acid methyl ester (PCBM) and phenyl-$C_{61}$-butyric acid cholestryl ester (PCBCR). The term "fullerene" may also refer to blends of the previously mentioned forms of fullerenes.

As used herein, the term "quantum dot" or "QD" refers to a semiconductor nanocrystal material in which excitons are confined in all three spatial dimensions, as distinguished from quantum wires (quantum confinement in only two dimensions), quantum wells (quantum confinement in only one dimension), and bulk semiconductors (unconfined). Also, many optical, electrical and chemical properties of the quantum dot may be strongly dependent on its size, and hence such properties may be modified or tuned by controlling its size. A quantum dot may generally be characterized as a particle, the shape of which may be spheroidal, ellipsoidal, or other shape. The "size" of the quantum dot may refer to a dimension characteristic of its shape or an approximation of its shape, and thus may be a diameter, a major axis, a predominant length, etc. The size of a quantum dot is on the order of nanometers, i.e., generally ranging from 1-1000 nm, but more typically ranging from 1-100 nm, 1-20 ran or 1-10 nm. In a plurality or ensemble of quantum dots, the quantum dots may be characterized as having an average size. The size distribution of a plurality of quantum dots may or may not be monodisperse. The quantum dot may have a core-shell configuration, in which the core and the surrounding shell may have distinct compositions. The quantum dot may also include ligands attached to its outer surface, or may be functionalized with other chemical moieties for a specific purpose.

As used herein, the term "electronic heterojunction" refers to two layers of dissimilar materials juxtaposed and in direct contact with each other. One layer serves as an electron donor while the other layer serves as an electron acceptor. The term "electronic heterojunction" encompasses the term "photovoltaic heterojunction" but also refers to a heterojunction as may be employed in an EL device, where one layer serves as a light-emissive layer in response to exciton decay, or the returning of an exciton to its unexcited state.

FIG. 1 is a schematic cross-sectional view of an example of an optoelectronic device 100 according to certain implementations of the present disclosure. In this specific example, the optoelectronic device 100 operates as a photovoltaic (PV) device (e.g., solar cell) although persons skilled in the art will appreciate that the optoelectronic device 100 may be adapted to function as another type of optoelectronic device. Generally, the optoelectronic device 100 is any optoelectronic device based on an electronic heterojunction 104 formed by a quantum dot (QD) layer 108 directly interfaced with a fullerene layer 112. In this QD-fullerene heterostructure, the QD layer 108 serves as an electron donor (or hole transporting) layer and the fullerene layer 112 serves as an electron acceptor (or electron transporting) layer. The QD layer 108 is photosensitive, forming excitons in response to absorption of light 116. The fullerene layer 112 is also photosensitive, forming excitons in response to absorption of light 116. In the case of a PV device or other type of light-absorbing device, the QD layer 108 may be disposed on an electrode 120 (serving as an anode), the fullerene layer 112 is directly disposed on the QD layer 108, and an electrode 124 (serving as a cathode) may be disposed on the fullerene layer 112. In a typical implementation, the electrode 120 is intended to transmit incident light 116 and thus is composed of a transparent material. In this case, the electrode 120 may be referred to as the front electrode (receiving incident light 116) and the other electrode 124 may be referred to as the back electrode. Typically, the electrode 120 is provided as a thin film or coating that is disposed on a suitable substrate 128. If the substrate 128 is composed of a transparent material, the substrate 128 may be retained in the final device as a protective layer. Alternatively, the substrate 128 may be removed by a suitable removal process such as, for example, dry etching, wet etching, (chemo)mechanical polishing, laser lift-off, or the like. In another embodiment of the device 100 the conductor 124 is nominally transparent, and the electrode 120 may or may not be transparent. In this embodiment the substrate 128 may or may not be transparent.

The optoelectronic device 100 may be placed in electrical communication with an electrical power-consuming load or storage device 132 (e.g., battery, circuit, electrical device, etc.)—or alternatively a power source in the case of a photodetector, an EL device, or the like—via electrical lines (wires, etc.) respectively connected to the electrode 120 and the electrode 124 by appropriate attachment means. In operation as a light-absorbing device, light 116 (or more generally, electromagnetic energy) passing through the electrode 120 induces the photogeneration of excitons (electron-hole pairs) in the QD layer 108. Light may also be absorbed in the fullerene layer 112, inducing photogenerated excitons in the fullerene 112 layer. The excitons are separated into electrons and holes at or near the junction between the QD layer 108 and the fullerene layer 112. The holes are transported through the QD layer 108 to the electrode 120 and the electrons are transported through the fullerene layer 112 to the electrode 124. As a result, current flows through the load or storage device 132. As appreciated by persons skilled in the art, the optoelectronic device 100 may include additional layers (not shown in FIG. 1) that facilitate rapid propagation of the holes and electrons to their respective electrodes 120 and 124 and/ or reduce the probability of electron-hole recombination. Also, the optoelectronic device 100 or an interconnected array of many such devices 100 may be packaged or encapsulated (not shown) as needed by any suitable means known to persons skilled in the art.

The QD layer 108 includes a plurality of quantum dots (QDs). The QD layer 108 may have a thickness ranging from 5 nm to 5 µm. In the present context, thickness is defined in the vertical direction from the perspective of FIG. 1, with the understanding that no limitation is placed on the particular orientation of the optoelectronic device 100 relative to any particular frame of reference. In implementations typical to the present teachings, the QDs are composed of inorganic semiconductor materials. In one particularly advantageous yet non-limiting example, the QDs are lead sulfide (PbS) crystals or particles. More generally, QDs may be selected from various Group II-VI, Group I-III-VI, Group III-V, Group IV, Group IV-VI, and Group V-VI materials. Examples include, but are not limited to, Group II-VI materials such as ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group I-III-VI materials such as $CuInS_2$, $Cu(In,Ga)S_2$, $CuInSe_2$, and $Cu(In,Ga)Se_2$; Group III-V materials such as AlN, AlP, AlAs, AlSb, GaN, GaP, GaAs, GaSb, InN, InP, InAs, and InSb; Group IV materials such as Si, Ge, and C; Group IV-VI materials such as GeSe, PbS, PbSe, PbTe, PbO, SnSe, SnTe, and SnS; and Group V-VI materials such as $Sb_2Te_3$, $Bi_2Te_3$, and $Bi_2Se_3$. Transition metal compounds such as the oxides, sulfides, and phosphides of Fe, Ni, and Cu may be applicable. Examples of QDs further encompass binary, ternary, quaternary, etc. alloys or compounds that include the foregoing species (e.g., SiGe, InGaAs, InGaN, InGaAsP, AlInGaP, etc.). Other QDs may include other types of semiconducting materials (e.g., certain organic and polymeric materials). For a QD having a core-shell structure, the shell may be composed of one of the foregoing species or other species, and the respective compositions of the core and the shell may be different—e.g., a core-shell composition might be CdSe—ZnS.

As appreciated by persons skilled in the art, the composition selected for the QDs may be based on a desired property such as band gap energy or wavelength sensitivity. As examples, QDs such as PbS, PbSe, PbTe, HgTe, InAs, InP, InSb, InGaAsP, Si, Ge or SiGe may be selected for IR sensitivity, while QDs such as CdS, CdSe or CdTe may be selected for visible sensitivity, and QDs such as ZnS or ZnSe for UV sensitivity. PbS and other IR-sensitive QDs are particularly useful in photovoltaic devices as a large portion of solar energy available for conversion by optoelectronic devices lies in the IR region. Blue-, UV-, and near-IR-absorbing (or emitting) QDs may also be selected. Moreover, the size of the QDs may be selected to absorb or emit a desired range of electromagnetic radiation. Generally for a given species of QD below a critical size, a smaller size is more sensitive to shorter (bluer) wavelengths and a larger size is more sensitive to longer (redder) wavelengths. Furthermore, the optoelectronic behavior of the QDs may be customized in dependence on their shape or their size distribution in the QD layer 108. Additionally, the QD layer 108 may include QDs of two or more different species (compositions) and/or two or more different specific sizes. This is useful when it is desired to extend the range of properties, behavior or performance of the QD layer 108. For example, a mixture of QDs in the QD layer 108 may be selected so that the QD layer 108 has enhanced responsiveness to different bands of electromagnetic spectra (e.g., visible and IR radiation, visible and UV radiation, etc.). Alternatively or additionally, more than one distinct QD layer 108 may be provided, each having a different composition or size of QDs. Two or more QD layers 108 may form a part of a corresponding number of separate QD-fullerene junctions within the optoelectronic device 100.

The QDs may be formed by various known techniques such as, for example, colloidal synthesis, plasma synthesis, vapor deposition, epitaxial growth, and nanolithography. The size, size distribution, shape, surface chemistry or other attributes of the QDs may be engineered or tuned to have desired properties (e.g., photon absorption and/or emission) by any suitable technique now known or later developed. The QD layer 108 may be formed on an underlying layer (e.g., the electrode 120 or an intervening layer) by any suitable method, particularly solution-based methods such as various known coating and printing methods, or doctor blading. In one example, the QDs are provided in a solution of an organic carrier solvent such as anisole, octane, hexane, toluene, butylamine, water, etc., with or without a matrix or host material, and are deposited to a desired thickness by spin-coating. Excess solvent may thereafter be eliminated by evaporation, vacuum or heat treatment. After formation, the QD layer 108 may or may not include residual solvent. The as-deposited QD layer 108 may be characterized as including a plurality, ensemble or array of QDs. The QDs may be closely packed, yet more or less free-standing, without inclusion of a matrix material. Without a matrix material, the QD layer 108 may be stabilized by London or Van der Waals forces. Alternatively, the QDs may be dispersed to a desired density or concentration in a matrix material, which may be composed of a polymer, sol-gel or other material that can easily form a film on the intended underlying surface. Generally, the matrix material selected is chosen to enhance the optical-to-electrical or electrical-to-optical conversion or other performance parameters of the QDs and of the overall optoelectronic device 100 contemplated. One example of such a matrix material is a semiconducting polymer such as poly-3-hexylthiophene. Alternatively the QDs may be stabilized by treating them as described below to render the film less soluble.

According to an aspect of the present teaching, the QD layer 108 is formed in a manner that results in low-defect density, thereby reducing local pinholes and shorting in the QD layer 108. As one example, the QDs are provided in a solution that includes at least one solvent component with relatively low volatility (such as, for example, anisole) or improved wetting to the underlying substrate (such as, for example, octane or other alkanes). In another example, the QD-inclusive solution is applied as multiple coats to increase film thickness and/or reduce pinholes. In another example, a QD film is deposited as a first coat and then subjected to a post-deposition treatment as described below to render the film less soluble. Then, an additional QD film is deposited as a second coat on the treated first coat, which helps to passivate any defects/pinholes in the QD layer 108. The iteration of depositing QD-inclusive films followed by post-deposition treatment of each film may be repeated a number of times as needed to attain a desired layer thickness or reduction in defect density.

According to an aspect of the present teaching, the as-formed QD layer 108 may be subjected to a post-deposition process or treatment that improves the electronic transport properties of the QDs and consequently improves the performance of the optoelectronic device 100. This is accomplished by exposing the QDs to a selected chemistry such as by immersing the QD layer 108/transparent conduct 120/substrate 128 structure in the chemical solution. Alternatively the as-formed QD layer 108 may undergo the treatment by exposing them to a vapor phase atmosphere that includes the selected chemical or chemicals. The chemical(s) utilized for treating the QD layer 108 may improve the charge carrier mobility and passivate defects or unsaturated surface bonds in the QD layer 108. In addition to improving the electronic properties of the QDs, the chemical treatment may result in substantial modification of the firm morphology. After chemical treatment the QD layer 108 may show an increased optical density, increased dot packing fraction, and/or increased mechanical and chemical robustness. These changes in the QD film morphology further contribute to the significant increase in charge carrier mobility and improvement in device performance. Examples of chemicals that may be utilized for the post-deposition treatment include one or more of the following: ethanethiol, alkyl-thiols, alkenyl-thiols, alkynyl-thiols, aryl-thiols, ethanedithiol, benzendithiol, alkyl-polythiols, alkenyl-polythiols, alkynyl-polythiols, aryl-polythiols, carboxlyic acids, formic acid, methanol, toluene, isopropyl alchohol, chloroform, acetonitrile, acetic acid, butyl amine, 1,4 butyl diamine, alkyl-amines, alkenyl-amines, alkynyl-amines, aryl-amines alkyl-polyamines, alkenyl-polyamines, alkynyl-polyamines, and aryl-polyamines.

Prior to the post-deposition process the QD layer 108 may, for example, have a charge carrier mobility in the range of $10^{-6}$-$10^{-4}$ cm$^2$/V-sec. As a result of the post-deposition process the QD layer 108 may, for example, have a charge carrier mobility in the range of $10^{-4}$-10 cm$^2$/V-sec. It is understood herein that QD layers that undergo a post-deposition chemical treatment to achieve a mobility >$10^{-4}$ cm$^2$/V-sec are considered to be high mobility QD layers. One of the characteristics of the high mobility QD layers may be a shorter distance between the surfaces of two adjacent QDs. This distance is called the interparticle spacing and may be 3 nm or greater for as-deposited QD layers and 2 nm or less for high mobility QD layers. The thickness of the high mobility QD layer may be reduced by 20% to 80% compared to the as-deposited QD layer because of the reduction in interparticle spacing. In another example, the thickness of the high mobility QD layer may be reduced by 40% to 70% compared to the as-deposited QD layer. An example of a reduction in thickness as a result of treatment of the QD layer is described below in conjunction with FIGS. 4A and 4B.

The fullerene layer 112 includes a plurality of fullerenes. The fullerene layer 112 may have a thickness ranging from 3 nm to 300 nm. The fullerenes may be formed by various known techniques such as organic synthesis or arc discharge between graphite electrodes. The fullerene layer 112 may further include a polymeric film or other suitable matrix material in which the fullerenes are dispersed. The fullerene layer 112 may be formed on the QD layer 108 by, for example, thermal evaporation, spin coating or any other deposition or film-forming technique suitable for providing a fullerene-inclusive layer of a desired thickness.

The electrode 120 may be any material that is electrically conductive and, when the electrode 120 is intended to receive incident light 116, optically transparent. In the present context, an electrically conductive material is generally one which would be considered acceptable for use as an electrode or contact for passing current in a commercial- or industrial-grade circuit, i.e., with an acceptable low level of resistive loss. An optically transparent material is generally one which passes a sufficient amount of incident light 116 through its thickness to irradiate the QDs of the QD layer 108, i.e., without significant reflection and absorption of photons. As one non-limiting example, a transparent material may be one that permits at least 50% of incident electromagnetic radiation 116 (of a desired wavelength or range of wavelengths) to be transmitted though the thickness of the material. Additionally, the material of the electrode 120 should be one which provides a surface suitable for deposition of the QDs, and which generally facilitates fabrication of the optoelectronic device 100 in a reliable, low-cost manner. Accordingly, the material of the electrode 120 may be of the type that can be deposited as a thin film on a substrate (i.e., the substrate 128).

Examples of the electrode 120 include, but are not limited to, transparent conductive oxides (TCOs), transparent metals, and transparent conductive polymers. TCOs may include, for example, tin oxide (TO), indium tin oxide (ITO), zinc oxide (ZnO), zinc indium oxide (ZIO), zinc indium tin oxide (ZITO), gallium indium oxide (GIO), and further alloys or derivatives of the foregoing. Tin oxide may also be doped with fluorine (F). ZnO may be doped with a Group III element such as gallium (Ga), and/or aluminum (Al), and thus may be more generally stoichiometrically expressed as $Zn_xAl_yGa_zO$ where $x+y+z=1$, $0 \le x \le 1$, $0 \le y \le 1$, and $0 \le z \le 1$. Other metal oxides may be suitable, as well as non-oxide thin-film semiconductors. In the case of metals, various metals (e.g., silver, gold, platinum, titanium, lithium, aluminum, magnesium, copper, nickel, and others), metal-inclusive alloys (including multi-layers or two or more different metals, with or without an adhesion-promoting layer such as tungsten), or metal-inclusive compounds may be employed as the electrode 120, so long as the metallic electrode 120 is thin enough to be transparent, i.e., has a "transparent thickness." If the optoelectronic device 100 is desired to be sensitive in the IR range, then the electrode 120 should be sufficiently transparent to IR wavelengths. The electrode 120 is typically fabricated on the substrate 128 by a vacuum deposition technique such as, for example, chemical vapor deposition (CVD), metalorganic CVD (MOCVD), radio-frequency (RF) or magnetron sputtering, molecular beam epitaxy (MBE), ion beam epitaxy, laser MBE, pulsed laser deposition (PLD), or the like. Depending on the composition, other deposition techniques such as thermal evaporation or sublimation may be suitable. A conductive polymer if sufficiently transparent may alternatively be employed as the electrode 120, and may be deposited by a solution-based process, spin coating, dip coating, spray coating, etc. One non-limiting example of a transparent conductive polymer is poly(3,4-ethylenedioxythiophene:polystryenesulfonate (PEDOT:PSS) and its chemical relatives and derivatives. A layer of conductive carbon nanotubes (CNTs) or nano-sheets (e.g. graphene) may be employed as the electrode 120, and may or may not include a matrix material surrounding the CNTs or nano-sheets. Electrode materials may also be combined to form a composite electrode 120. One example is the use of a TCO, such as ITO, combined with a conductive polymer to improve the interface quality, such as PEDOT:PSS. In another embodiment conductor 120 does not need to be transparent and may be selected from metals, metal-inclusive alloys, or metal-inclusive compounds. One or both electrodes 120 or 124 should be transparent.

The electrode 124 may also be provided pursuant to the description above regarding the electrode 120. In typical implementations of the optoelectronic device, the electrode 124 does not need to be transparent and thus its composition is typically selected from metals, metal-inclusive alloys, or metal-inclusive compounds. The electrode 124 may be selected based on its work function or its utility as an ohmic contact. The electrode 124 may cover the entire surface of the underlying layer on which it is deposited (e.g., the fullerene layer 112 in the present example) or a portion of the underlying surface. Moreover, more than one physically distinct electrode 124 may be provided, such as by providing a layer of conductive material and subsequently forming electrodes 124 from the conductive layer by any suitable technique. In one preferred example the electrode 124 is composed of aluminum.

The substrate 128 may generally have any composition suitable for fabricating the electrode 120, and may depend on such factors as the type of deposition technique utilized, whether the substrate 128 needs to be transparent, whether the substrate 128 needs to be removed from the electrode 120 after fabrication, the end use of the optoelectronic device 100, etc. Thus, the composition of the substrate 128 may generally include various glasses (including optical-grade), ceramics (e.g., sapphire), metals, dielectric materials, electrically conductive or insulating polymers, semiconductors, semi-insulating materials, etc.

Figure 2:
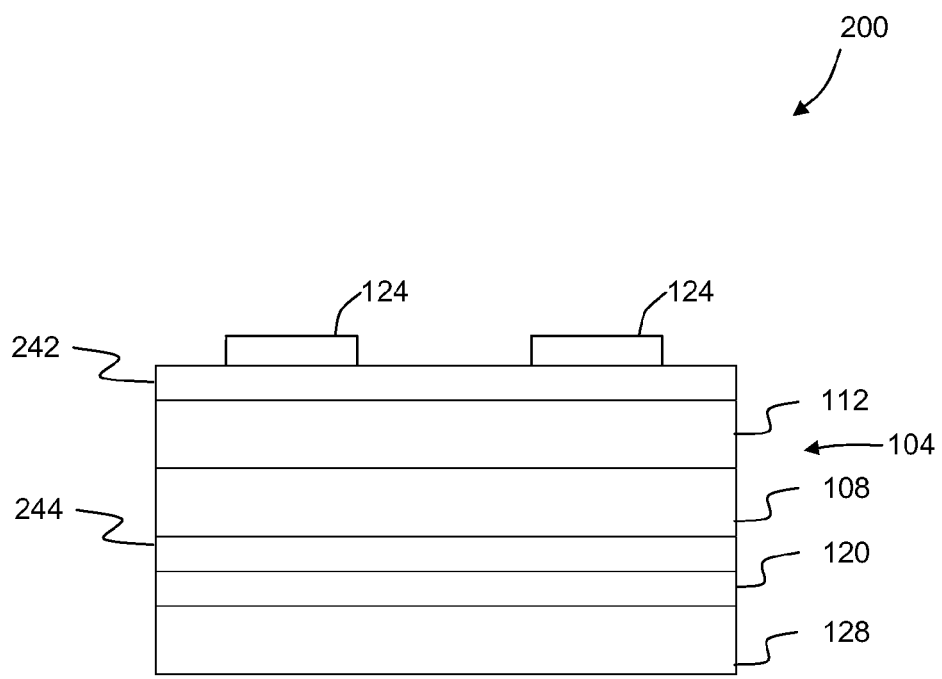
FIG. 2 is a schematic cross-sectional view of another example of an optoelectronic device according to certain implementations of the present disclosure.

FIG. 2 is a schematic cross-sectional view of another example of an optoelectronic device 200 according to certain implementations of the present disclosure. In this implementation, one or more additional layers of materials are provided to improve a performance-related attribute such as quantum efficiency or power conversion efficiency. For example, a hole blocking layer 242 may be interposed between the fullerene layer 112 and the electrode 124 to prevent holes from traveling toward the electrode and possibly combining with a free electron near the electrode surface. The hole blocking layer 242 may be composed of any organic or inorganic material suitable for providing the hole blocking function. Examples include, but are not limited to, inorganic compounds such as $TiO_2$ or ZnO, organic compounds such as 2,9-dimethyl-4,7-diphenyl-1,10-phenanthroline (bathocuproine or BCP), 4,7-diphenyl-1,10-phenanthroline (bathophenanthroline or BPhen), 2,9-bis(naphthalen-2-yl)-4,7-diphenyl-1,10-phenanthroline (NBPhen), or a metal chelate complex such as tris-8-hydroxy-quinolinato aluminum (Alq3), and chemical relatives and derivatives of the foregoing. Several organic compounds conventionally utilized as electron transporting or hole blocking layers in organic optoelectronic devices may be effective as the hole blocking layer 242 in the present implementation. The hole blocking layer 242 may also include a doped layer that provides enhanced carrier concentration. Dopants may include organic molecules or alkali metals such as lithium or cesium. The thickness of the hole blocking layer 242 will generally depend on its composition. In some examples, the thickness of the hole blocking layer 242 ranges from 1 nm to 100 nm.

In other implementations, in addition or as an alternative to the hole blocking layer 242, the optoelectronic device 200 may include an electron blocking layer 244 interposed between the electrode 120 and the QD layer 108 to prevent electrons from traveling toward the electrode 120 and possibly combining with a hole. The electron blocking layer 244 may be composed of any organic or inorganic material suitable for providing the electron blocking function. Examples include, but are not limited to, molybdenum trioxide ($MoO_3$), tungsten trioxide ($WO_3$), copper oxide ($CuO_x$), nickel oxide ($NiO_x$), a phthalocyanine such as copper phthalocyanine (CuPc) or tin phthalocyanine (SnPc) (but not limited to metal-Pc compounds), 4,4',4''-tris(3-methylphenylphenylamino)-triphenylamine (m-MTDATA), N,N'-bis(1-naphthyl)-N,N'-diphenyl-(1,1'-biphenyl)-4,4'-diamine (α-NPD), and chemical relatives and derivatives of the foregoing. Additionally, QDs that have potential energies that are different than the QDs in layer 108 may be employed as the electron blocking layer 244. Materials with high conductivity are generally not suitable as charge recombination may occur within or adjacent to these layers. It may be desirable to modify the properties of the electron blocking layer 244 after it is deposited to improve its effectiveness. These treatments can include annealing in various oxidizing or reducing atmospheres or exposure to an oxidizing or reducing plasma. Appropriate oxidizing or reducing species and reaction chambers are known to persons skilled in the art and thus need not be described in detail herein. Several organic compounds conventionally utilized as hole transporting or electron blocking layers in organic optoelectronic devices may be effective as the electron blocking layer 244 in the present implementation. The thickness of the electron blocking layer 244 will generally depend on its composition. In some examples, the thickness of the electron blocking layer 244 ranges from 1 nm to 100 nm.

In some implementations, it may be advantageous for the electron blocking layer 244 to be fabricated such that it only partially covers the electrode 120. An electron blocking layer 244 providing partial coverage may be termed a discontinuous layer or film. A discontinuous electron blocking layer 244 may provide the best combination of exciton and/or electron blocking capability while allowing efficient transport of holes to the electrode 120. This partial coverage may be formed by known patterning techniques, or by depositing the film under appropriate conditions such that it results in only partial coverage. Examples of patterning techniques include, but are not limited to, the use of masks, deposition by ink-jet printing, etc. In some implementations, the discontinuous electron blocking layer 244 has a configuration in which islands or regions of the electron blocking material are separated or surrounded by areas that do not contain the electron blocking material (i.e., the absence of electron blocking material at the planar level of the electron blocking layer 244). In other implementations, the discontinuous electron blocking layer 244 has a configuration in which areas not containing the electron blocking material are surrounded by the electron blocking material. Hence, in a discontinuous electron blocking layer 244 the majority of the planar area of the electron blocking layer 244 may or may not be occupied by the electron blocking material. When a discontinuous electron blocking layer 244 is provided as a pattern, the pattern may be regular or irregular. Examples of patterns include, but are not limited to, a series of stripes, an array of polygons, an array of circles or dots, etc.

Depending on its composition and the properties of the semiconductor layer with which it is interfaced, a hole blocking layer 242 and/or an electron blocking layer 244 such as those noted above may also serve as an exciton blocking layer to confine photogenerated excitons to the region of the heterojunction where they need to be dissociated and keep them away from the electrode/semiconductor interfaces. Anode-side and/or cathode-side exciton blocking layers may also be provided in addition to the hole blocking layer 242 and/or the electron blocking layer 244. As appreciated by persons skilled in the art, the composition of the exciton blocking layer may be dictated by whether it is positioned adjacent to an anode (e.g., the electrode 120) or a cathode (e.g., the electrode 124), so that the exciton blocking layer does not impair hole transport or electron transport in the relevant direction. It is also appreciated that hole blocking layers, electron blocking layers, and exciton blocking layers may be doped with other compounds as needed for a variety of purposes such as enhancing mobility or stabilizing their structures. Moreover, these types of layers may also be desirable as protective layers to protect as-deposited underlying layers during the fabrication process. Persons skilled in the art will appreciate the applicability of chemical derivatives or relatives of the foregoing examples of materials, as well as similarly behaving alternatives of such materials, that may be utilized as the hole blocking layer, the electron blocking layer, and the exciton blocking layer.

If organic compositions are selected for the hole blocking layer 242, the electron blocking layer 244, and/or any additional exciton blocking layer(s), such organic layers may be deposited in the same deposition chamber utilized for growing or depositing the electrode 120 and/or 124. In this case, organic layers may be deposited by organic vapor-phase deposition (OPVD), organic molecular beam deposition, or any other suitable deposition technique. Alternatively, organic layers may be deposited by spin-coating, dip coating, spray coating, ink jet printing, gravure printing, evaporation, sublimation, or the like.

In another implementation, the device may be fabricated by reversing the order of layers described herein, such that the QD layer 108 is deposited onto the fullerene layer 112. It is understood that the properties of the heterojunction and the function of the constituent layers remains the same.

The unique QD-fullerene heterojunction constitutes a substantial improvement over previously known heterojunctions. In particular, the QD-fullerene heterojunction exhibits increased light absorption and light absorption at wavelengths not accessible by other heterojunctions. A consequence of the improved light absorption is a higher photocurrent density. The heterojunction exhibits efficient charge separation and high open circuit voltages relative to the energy gap, leading to a higher power conversion efficiency as compared to devices based on other types of heterojunctions. Another improvement includes the post-deposition treatment of the QD layer 108 to improve the charge transport properties of this layer. This technique increases charge separation efficiency, increases charge extraction efficiency, lowers the series resistance, and allows the use of a thicker QD layer 108 without reducing efficiency. Another improvement is the use of an electron blocking layer 244 as described above, which increases charge separation efficiency by reducing exciton recombination at the electrode-QD layer interface, and helps to limit the deleterious effects of defects in the QD layer 108.

Optoelectronic devices implementing a QD-fullerene heterojunction as described herein have exhibited performance characteristics demonstrating some of the advantages of this heterojunction. In one example, a photovoltaic device was fabricated based on the structure illustrated in FIG. 1 and included the electron blocking layer 244 illustrated in FIG. 2. A 2 nm thick $MoO_3$ electron blocking layer 244 was deposited on a glass substrate 128 coated with an ITO electrode 120. The QD layer 108 was formed on the electron blocking layer 244 by spin coating a solution of butylamine capped PbS QDs in octane with a concentration of 50 mg/ml. After allowing excess solvent to evaporate, the resulting QD layer 108 had a thickness of approximately 80 nm. The QD layer 108 was then treated by immersion in 5% formic acid in acetonitrile for 5 minutes. The fullerene layer 112 was then formed on the QD layer 108 by thermal evaporation of a 30 nm layer of $C_{60}$ fullerenes. A 5 nm layer of BCP was then formed on the fullerene layer 112 by thermal evaporation to serve as a hole blocking layer 242. An electrode 124 was then deposited on the BCP consisting of a 100 nm thick layer of Al followed by a 100 nm thick layer of Ag. A Xe light source with a filter approximating the AM1.5G solar spectrum was calibrated using a NIST-traceable Si reference cell to produce 100 mW/cm² irradiance. The glass-side of the photovoltaic device was irradiated using this source with the sample at ambient temperature and without protection from ambient oxygen and moisture. The area of the electrode 124 was measured using a calibrated microscope to be ~0.75 mm². The current was measured as a function of applied voltage using a Keithley 2400 SourceMeter power supply/meter to produce the I-V data in FIG. 3. This photovoltaic device exhibited power conversion efficiencies of 4.5% according to the equation PCE=$I_{SC} \times V_{OC} \times FF$, where PCE is the power conversion efficiency, $I_{SC}$ is the short-circuit current, $V_{OC}$ is the open circuit voltage, and FF is the fill factor, according to their standard definitions, respectively.

The charge carrier mobility of the QD layers was measured using the field effect mobility technique. QD films were fabricated on separate substrates, but employing identical process steps for the QD layer as those in the PV devices. In this method a thin film field effect transistor (FET) is fabricated using QDs and the FET mobility is extracted from the measurement of the gate voltage versus drain current transfer curve of the device. If the charge carrier mobility is measured by other techniques, or using a different physical implementation of the QD layer, or under different conditions, such as at a different temperature, a different measured value may be obtained. Therefore the term mobility in this context refers to the values measured using field effect technique and the device structure described herein, with measurements made at ambient temperatures, and using a QD layer in the FET device that is processed in an identical manner to the QD layer used in the PV device. Furthermore, mobility in certain material systems is known to have a dependence on applied voltage. All of the mobility values described here are for device with source-gate and source-drain voltages spanning the range of −20V to +20V.

The FET device is fabricated as follows. First, a 50 nm thick SiO₂ layer is grown by thermal oxidation of a conductive crystalline silicon substrate. The substrate serves as the gate electrode and the SiO₂ serves as the gate dielectric. Au source and drain electrodes are patterned and deposited onto the SiO₂. The source and drain electrodes are separated by a 5 μm wide gap which is the FET channel length, and are 2.5 mm wide which is the FET channel width. The QD layer is deposited by spin coating a solution of QDs onto the FET substrate, forming a film of material that lies on top of the gate dielectric, and connects the source and drain electrodes. The combination of the gate electrode, the gate dielectric, the source and drain electrodes, and the QD film, form the FET device.

To measure the mobility of the QD film a fixed voltage is applied between the source and drain electrodes and the current between them is measured. The fixed voltage is chosen to be in the portion of the FET response where source-drain current varies linearly with drain voltage, commonly known as the linear regime. The gate voltage is then varied and the source-drain current is measured for each value of gate voltage. The plot of gate voltage versus source drain current is the transfer curve of the FET device. The QD mobility is extracted using the slope of the transfer curve, the value of the voltage applied between the source and drain electrodes, and the geometry of the device structure according to the equation $$g_m = \frac{WC_i V_{ds}}{L}\mu$$

where $g_m$ (the transconductance) is the slope of the transfer curve, W is the transistor width, $C_i$ is the gate oxide capacitance, L is the transistor length, $V_{ds}$ is the applied drain-source voltage, and μ is the FET mobility.

To illustrate the impact that QD charge carrier mobility has on the power conversion efficiency of QD-fullerene junction PV devices we have fabricated devices with low carrier mobility similar to those described by Dissanayake et al., cited above. We then fabricated devices with a high carrier mobility QD layer as described herein and compared their performance to those containing low mobility QDs.

The low mobility QD material had a measured FET mobility of $1 \times 10^{-4}$ cm²/V-s. QD-fullerene devices fabricated with a low mobility QD layer had a power conversion efficiency of 0.4%. By comparison, devices fabricated with high QD mobility had a measured FET mobility of $4.5 \times 10^{-3}$ cm²/Vs. QD-fullerene devices fabricated with a high mobility QD layer had a power conversion efficiency of 4.5%.

This experiment demonstrates that to obtain power conversion efficiencies in excess of 4% in a QD-fullerene junction device, the mobility in the QD layer must be in excess of $1 \times 10^{-4}$ cm²/V-s. The formic acid treatment employed in the fabrication of the QD films in this example is one method for obtaining QD films with mobilities greater than $1 \times 10^{-4}$ cm²/V-s, however other methods and variations are also possible as indicated above.

Figure 3:
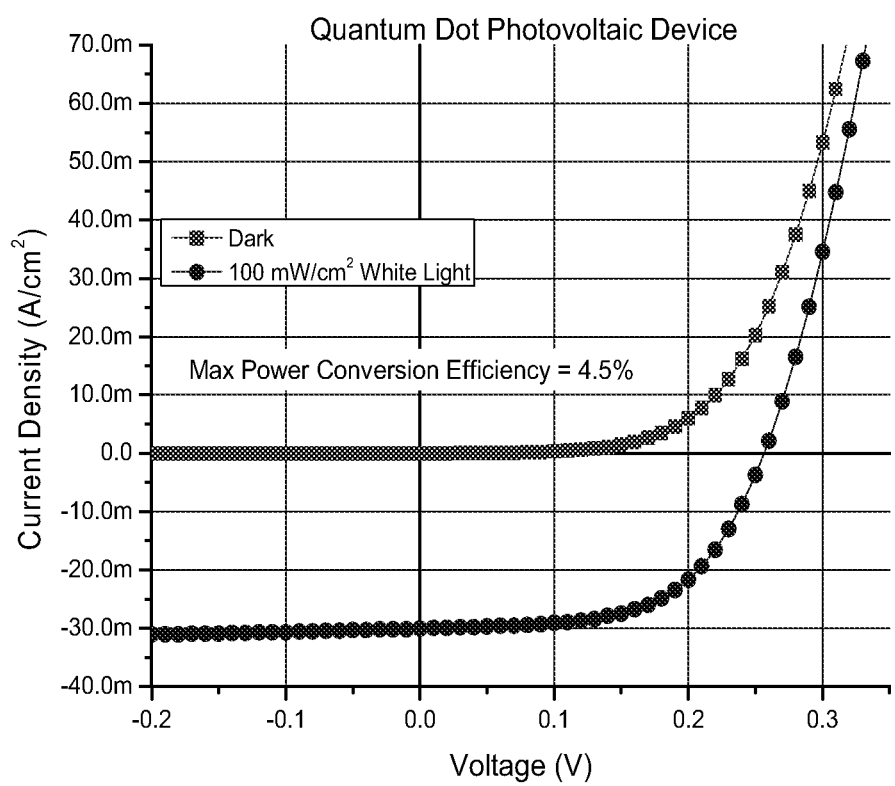
FIG. 3 is a plot of current density as a function of voltage under dark and illuminated conditions for an example of a photovoltaic device fabricated according to one implementation of the present disclosure.

This power conversion efficiency exhibited by the device in FIG. 3 is ~20 times higher than the device reported by Dissanayake et al. due to the improvements in the current embodiment. With further refinements of the device structure and fabrication process, improved power conversion efficiencies are expected.

Figure 4A:
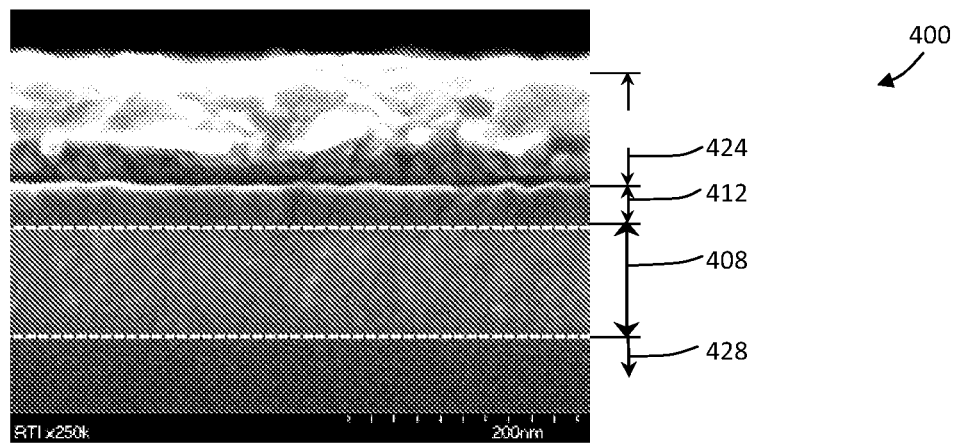
FIG. 4A is an SEM image of a composite structure that includes a quantum dot/fullerene heterojunction fabricated in accordance with the present disclosure.
Figure 4B:
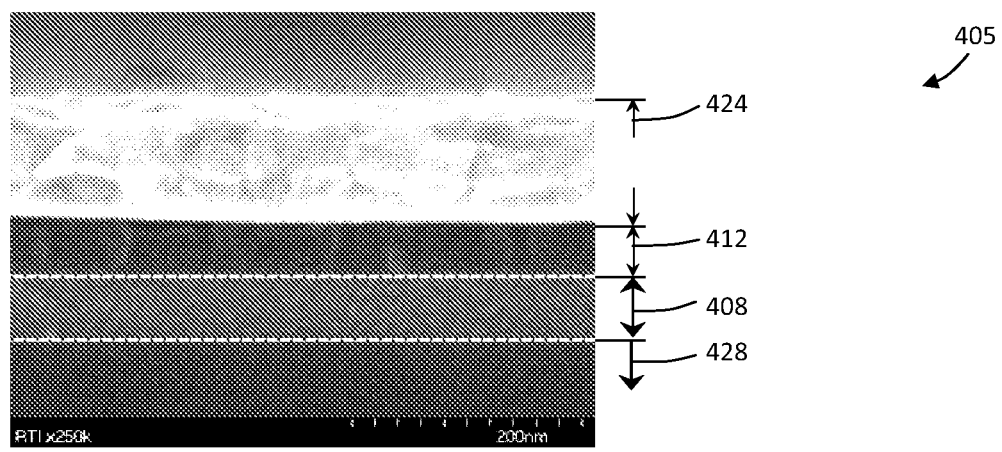
FIG. 4B is an SEM image similar to FIG. 4A, but in which the quantum dots have been treated in accordance with a technique disclosed herein.

FIG. 4A is an SEM (scanning electron microscopy) image of a composite structure 400 that includes a quantum dot/fullerene heterojunction fabricated in accordance with the present disclosure for testing purposes. FIG. 4B is an SEM image of a composite structure 405 similar to FIG. 4A, but in which the quantum dots have been treated in accordance with a technique disclosed herein. In each case, the material system is as follows: silicon substrate 428/lead sulfide (PbS) QD layer 408/$C_{60}$ and hole blocking layer 412/metal contact 424. The two composite structures 400 and 405 were fabricated in an identical manner, with the exception of the QD layer 408. In the composite structure 400 of FIG. 4A, the PbS QDs were untreated and the QD layer 408 had a thickness of 92 nm. By comparison, in the composite structure 405 of FIG. 4B, the PbS QDs after deposition were modified by a treatment of formic acid. This treatment caused a reduction in interparticle spacing in the QD layer 408 of the composite structure 405, thereby resulting in a reduction in film thickness. The thickness of the resulting formic acid treated QD layer 408 in the composite structure 405 was measured to be 52 nm.

In other implementations, the optoelectronic device may include multiple active electronic junctions or subcells, which may improve efficiency. For instance, the optoelectronic device may have a stacked configuration that includes alternating or periodic QD layers 108 and fullerene layers 112. Optionally, conductive (charge transporting) layers may be interposed between each QD-fullerene bilayer heterostructure. As another alternative, the optoelectronic device may have a stacked configuration that includes at least one QD-fullerene bilayer heterostructure and one or more additional heterojunctions formed by other types of electron donor and electron acceptor materials (e.g., organic heterojunctions, inorganic heterojunctions). In this latter case, the QD-fullerene bilayer heterostructure may be provided for a specific purpose (e.g., IR sensitivity) while the other type of heterostructure is provided for a different purpose (e.g., visible light sensistivity).

In other implementations, the system of layers illustrated in FIGS. 1 and 2 may be utilized as a photodetector. As appreciated by persons skilled in the art, this may be accomplished by applying an external bias and providing additional circuitry appropriate for the photodetecting application.

In still other implementations, the system of layers illustrated in FIGS. 1 and 2 may be utilized, or modified and certain layers omitted or added as needed, to produce a light-emitting diode (LED) or other type of electroluminescent or photoluminescent device useful as a light source or for transmission of information. In most instances, the active semiconductor structure of an EL device generally includes a junction of a conductive, hole-transporting layer and a light-emissive, electron-transporting layer. Light generated in the light-emissive layer passes through the hole-transporting layer and the electrode (anode). Additionally or alternatively, the cathode may be transparent so as to pass light directly from the light-emissive layer. As appreciated by persons skilled in the art one or more layers of appropriate materials may be provided on either side of the active junction to function as reflectors. Schematically, the load 132 depicted in FIG. 1 may replaced with a voltage source for EL devices. QDs as described above may be utilized to provide luminescence specific to one or more desired wavelengths or spectral ranges. To improve efficiency, the semiconductor structure may include more than one active photogenic QD-fullerene junction. Alternatively, separate QD layers may be provided with different types or sizes of QDs. For example, one QD layer may be an IR- or UV-absorbing or (detecting) layer that provides a photocurrent that activates another QD layer to emit visible light in response. Alternatively, the absorbing/detecting and emission functions may be integrated in a single QD layer containing a mixture of different QDs.

The various layers of materials are schematically depicted in FIGS. 1 and 2 as being planar. It will be understood, however, that the optoelectronic devices disclosed herein are not limited to any particular geometry. The optoelectronic devices may have a curved profile or some other shape. Moreover, depending on the materials utilized, the optoelectronic devices may be flexible.

The interface between the QD layer 108 and the fullerene layer 112 is schematically depicted in FIGS. 1 and 2 as being planar. It will be understood, however, that the junction may not be smooth or abrupt. It is possible that the junction includes a mixed region that contains both quantum dots and fullerenes. It is also possible that the layers are formed in such a way that regions of quantum dots and fullerenes form a network of interpenetrating regions that are predominantly quantum does and predominantly fullerenes, respectively. Additionally, vertical structures such as pillars, pores, mesas, or other microscale or nanoscale structures that provide increased heterojunction area per unit substrate area may be used to enhance or manipulate light absorption. Such structures may employ the same heterojunction as the planar structure, but in these other examples the junction may be extended in three dimensions.

While examples of QD-fullerene junction based devices have been described herein primarily in the context of optoelectronics, persons skilled in the art will appreciate that the QD-fullerene heterostructure taught herein may be applied to microelectronic devices in general. That is, the use of the QD-fullerene heterostructure as an electronic junction is not limited to photo-specific applications. As non-limiting examples, the QD-fullerene structure may be utilized in a display device (e.g., flat panel display), a transistor, an optical MEMS device, a microfluidic device, a lab-on-a-chip, a surgically implantable device, etc.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An optoelectronic device, comprising:
 a first electrode;
 an electron blocking layer disposed on the first electrode;
 a quantum dot layer disposed on the electron blocking layer and comprising a plurality of quantum dots;
 a fullerene layer disposed directly on the quantum dot layer, wherein the quantum dot layer and the fullerene layer form an electronic heterojunction; and
 a second electrode disposed on the fullerene layer.

2. The optoelectronic device of claim 1, wherein the first electrode or the second electrode is selected from the group consisting of conductive oxides, metals, metal alloys, metal-inclusive compounds, CNTs, and conductive polymers.

3. The optoelectronic device of claim 1, wherein the quantum dots are selected from the group consisting of visible light-sensitive quantum dots, infrared-sensitive quantum dots, and ultraviolet-sensitive quantum dots.

4. The optoelectronic device of claim 1, wherein the quantum dots have a composition selected from the group consisting of Group II-VI, Group I-III-VI, Group III-V, Group IV, Group IV-VI, and Group V-VI materials.

5. The optoelectronic device of claim 1, wherein the quantum dots are composed of lead sulfide, lead selenide, lead telluride, mercury telluride, or alloys thereof.

6. The optoelectronic device of claim 1, wherein the quantum dot layer has a thickness ranging from 5 nm to 5 µm.

7. The optoelectronic device of claim 1, wherein the plurality of quantum dots comprises a plurality of first quantum dots and a plurality of second quantum dots, and the first quantum dots have a first average size and the second quantum dots have a second average size different from the first average size, or the first quantum dots have a first composition and the second quantum dots have a second composition different from the first composition.

8. The optoelectronic device of claim 1, wherein the fullerenes are selected from the group consisting of $C_n$ fullerenes where n is 20 or greater, endohedral fullerenes, fullerene derivatives, and a combination of two or more of the foregoing.

9. The optoelectronic device of claim 1, wherein the fullerene layer has a thickness ranging from 3 nm to 300 nm.

10. The optoelectronic device of claim 1, further comprising a hole blocking layer disposed on the fullerene layer, wherein the second electrode is disposed on the hole blocking layer.

11. The optoelectronic device of claim 10, wherein the hole blocking layer has a composition selected from the group consisting of titanium oxides, zinc oxides, BCP, BPhen, NBPhen, metal chelates, and chemical relatives and derivatives of the foregoing.

12. The optoelectronic device of claim 1, wherein the electron blocking layer has a composition selected from the group consisting of molybdenum oxides, tungsten oxides, copper oxides, nickel oxides, phthalocyanines, m-MTDATA, α-NPD, quantum dots, and chemical relatives and derivatives of the foregoing.

13. The optoelectronic device of claim 1, wherein the electron blocking layer comprises a discontinuous layer.

14. The optoelectronic device of claim 13, wherein the electron blocking layer comprises a pattern of electron blocking material.

15. The optoelectronic device of claim 1, further comprising an exciton blocking layer disposed on the fullerene layer or on the first electrode.

16. The optoelectronic device of claim 1, wherein the quantum dot layer exhibits a charge carrier mobility greater than $1 \times 10^{-4}$ cm$^2$/V-sec.

17. The optoelectronic device of claim 1, wherein the quantum dot layer exhibits a charge carrier mobility ranging from greater than $1 \times 10^{-4}$ cm$^2$/V-sec to 10 cm$^2$/V-sec.

18. The optoelectronic device of claim 1, wherein the quantum dot layer is a chemically treated quantum dot layer that exhibits increased charge carrier mobility relative to an untreated quantum dot layer.

19. The optoelectronic device of claim 1, wherein the quantum dot layer exhibits an interparticle spacing of 2 nm or less.

20. The optoelectronic device of claim 1, wherein the optoelectronic device has a power conversion efficiency of at least 4.5% when illuminated by an incident white light beam of 100 mW/cm$^2$.

21. A method for fabricating an optoelectronic device, the method comprising:
    depositing an electron blocking layer on an electrode;
    depositing a quantum dot layer on the electron blocking layer, the quantum dot layer comprising a plurality of quantum dots; and
    depositing a fullerene layer directly on the quantum dot layer, wherein the quantum dot layer and the fullerene layer form an electronic heterojunction.

22. The method of claim 21, wherein depositing the quantum dot layer comprises depositing a solution comprising the plurality of quantum dots and a solvent.

23. The method of claim 22, wherein the solvent is selected from the group consisting of toluene, anisole, alkanes, butylamine, and water.

24. The method of claim 21, wherein depositing the quantum layer comprises depositing a first quantum dot film on the fullerene layer, followed by depositing one or more additional quantum dot films on the first quantum dot film.

25. The method of claim 21, comprising, after depositing the quantum dot layer or one or more additional quantum dot films, treating the quantum dot layer or one or more of the additional quantum dot films with a chemistry that increases a charge carrier mobility of the quantum dot layer.

26. The method of claim 25, wherein the chemistry comprises a solution or vapor having a composition selected from the group consisting of ethanethiol, alkyl-thiols, alkenyl-thiols, alkynyl-thiols, aryl-thiols, ethanedithiol, benzendithiol, alkyl-polythiols, alkenyl-polythiols, alkynyl-polythiols, aryl-polythiols, carboxlyic acids, formic acid, methanol, toluene, isopropyl alchohol, chloroform, acetonitrile, acetic acid, butyl amine, 1,4 butyl diamine, alkyl-amines, alkenyl-amines, alkynyl-amines, aryl-amines alkyl-polyamines, alkenyl-polyamines, alkynyl-polyamines, aryl-polyamines.

27. The method of claim 21, further comprising depositing a hole blocking layer or an exciton blocking layer on the fullerene layer.

28. The method of claim 21, further comprising depositing an exciton blocking layer on the electrode.

29. A method for fabricating an optoelectronic device, the method comprising:
    depositing a quantum dot layer on an electrode, the quantum dot layer comprising a plurality of quantum dots;
    treating the quantum dot layer with a chemistry that increases charge carrier mobility in the quantum dot layer; and
    depositing a fullerene layer directly on the quantum dot layer, wherein the quantum dot layer and the fullerene layer form an electronic heterojunction.

30. The method of claim 29, comprising depositing an electron blocking layer on the electrode, wherein the quantum dot layer is deposited on the electron blocking layer.

31. The method of claim 29, comprising subjecting the electron blocking layer to an oxidizing or reducing treatment.

32. The method of claim 29, comprising treating the quantum dot layer with a chemistry selected from a chemistry that reduces an interparticle spacing between quantum dots, a chemistry that reduces an as-deposited thickness of the quantum dot layer, or a chemistry that both reduces the interparticle spacing and the as-deposited thickness of the quantum dot layer.

33. The method of claim 32, comprising reducing the interparticle spacing to 2 nm or less, or reducing the as-deposited thickness by 20 to 80%.

\* \* \* \* \*